US007868372B2

(12) United States Patent
Chen et al.

(10) Patent No.: US 7,868,372 B2
(45) Date of Patent: Jan. 11, 2011

(54) DEPLETION-MODE SINGLE-POLY EEPROM CELL

(75) Inventors: Jung-Ching Chen, Dadu Township, Taichung County (TW); Ming-Tsung Tung, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 289 days.

(21) Appl. No.: 11/484,225

(22) Filed: Jul. 10, 2006

(65) Prior Publication Data

US 2008/0007998 A1   Jan. 10, 2008

(51) Int. Cl.
*H01L 29/788* (2006.01)
*H01L 27/12* (2006.01)
*H01L 27/15* (2006.01)

(52) U.S. Cl. ............... 257/315; 257/348; 257/E27.103; 257/501

(58) Field of Classification Search ................. 257/315, 257/348, 500, 501, E27.103
See application file for complete search history.

(56) References Cited

U.S. PATENT DOCUMENTS

| 4,366,555 | A | 12/1982 | Hu ............................... 365/185 |
| 5,081,054 | A | 1/1992 | Wu et al. ........................ 437/43 |
| 5,301,150 | A | 4/1994 | Sullivan et al. ............. 365/185 |
| 5,761,121 | A * | 6/1998 | Chang .................... 365/185.14 |
| 5,917,222 | A * | 6/1999 | Smayling et al. ............ 257/370 |
| 5,940,324 | A * | 8/1999 | Chi et al. ................ 365/185.27 |
| 6,054,732 | A | 4/2000 | Ho et al. ....................... 257/314 |
| 6,261,884 | B1 | 7/2001 | Ho et al. ....................... 438/199 |
| 6,265,270 | B1 | 7/2001 | Lee et al. ..................... 438/278 |
| 6,433,645 | B1 | 8/2002 | Mann et al. .................... 331/18 |
| 6,492,676 | B2 * | 12/2002 | Kusunoki ................... 257/316 |
| 6,711,064 | B2 | 3/2004 | Hsu et al. ............. 365/185.29 |
| 6,734,065 | B2 * | 5/2004 | Yim et al. .................... 438/257 |
| 6,747,308 | B2 | 6/2004 | Mitros et al. ................ 257/315 |

(Continued)

FOREIGN PATENT DOCUMENTS

CN   1433064   7/2003

OTHER PUBLICATIONS

Henry Schauer et al., "A High-Density, High-Performance EEPROM Cell" IEEE Transactions on Electron Devices, vol. ED-29, No. 8, Aug. 1982, pp. 1178-1185.

(Continued)

*Primary Examiner*—Anh Phung
*Assistant Examiner*—Allison P Bernstein
(74) *Attorney, Agent, or Firm*—WPAT, P.C.; Justin King (57) ABSTRACT

A method for forming a depletion-mode single-poly electrically erasable programmable read-only memory (EEPROM) cell is provided. The method includes providing a substrate having a floating region and a control region. Then, an isolation deep well and a deep well are formed in the floating region and the control region of the substrate respectively. A well region is formed in the isolation deep well simultaneously with forming an isolation well region between the isolation deep well and the deep well in the substrate. A depletion doped region and a cell implant region are formed at the well region of the substrate and the deep well of the substrate respectively. A floating gate structure is formed across over the floating region and the control region. An implantation process is performed to form a source/drain region and a heavily doped region in the depletion doped region and the cell implant region respectively.

20 Claims, 5 Drawing Sheets

U.S. PATENT DOCUMENTS

| | | |
|---|---|---|
| 7,015,100 B1 * | 3/2006 | Lee et al. .................... 438/257 |
| 7,671,401 B2 * | 3/2010 | Fang et al. ................. 257/318 |
| 2006/0054966 A1 | 3/2006 | Chen et al. ................. 257/316 |

OTHER PUBLICATIONS

Richard D. Jolly et al., "A 35-ns. 64K EEPROM" IEEE Journal of Solid-State Circuits, vol. sc-20, No. 5, Oct. 1985, pp. 971-978.

* cited by examiner

DEPLETION-MODE SINGLE-POLY EEPROM CELL

BACKGROUND OF THE INVENTION

1. Field of Invention

The present invention relates to a non-volatile memory cell and methods for forming and operating the same. More particularly, the present invention relates to a single-poly electrically erasable programmable read-only memory (EEPROM) cell and methods for forming and operating the same.

2. Description of Related Art

Being affected by the increasing popularity of the consuming electronic products, the non-volatile memory, in which the data and contents are still stored even the power is off, is widely used in various electronic equipments such as multimedia or portable multimedia including digital camera, audio player and cellular phone. Integrating the manufacture of the non-volatile memory with the manufacture of other devices such as CMOS, logic device, high voltage device or low voltage device becomes one of the development tendencies.

Conventionally, the electrically erasable programmable read-only memory (EEPROM) is one kind of non-volatile memory. Typically, an EEPROM cell comprises two stacked gates which include a polysilicon floating gate used for storing charges therein and a polysilicon control gate for controlling the access of the data. Usually, the floating gate is at a floating situation and is not electrically connected to any other circuit. Additionally, the control gate is connected to the word line. Furthermore, the control gate is stacked over the floating gate and is electrically separated from the floating gate with a dielectric layer.

Since the conventional EEPROM possesses two stacked polysilicon gates, the step height of the EEPROM is larger than the step heights of any other single-layer polysilicon devices. Therefore, the difficulty for integrating the manufacture of the EEPROM and the manufacture of the other devices is increased. Besides, in order to integratedly manufacture two-layer polysilicon EEPROM and the single-layer polysilicon devices, the number of masks used in the integrated manufacturing process is increased and the manufacturing process becomes more complicated.

SUMMARY OF THE INVENTION

Accordingly, at least one objective of the present invention is to provide a method for forming a depletion-mode single-poly EEPROM cell capable of integrating with the formation of the high voltage device.

At least another objective of the present invention is to provide a depletion-mode single-poly EEPROM cell capable of being operated in a relatively wide operating voltage so as to be embedded with other devices.

At least the other objective of the present invention is to provide a programming method of a depletion-mode single-poly EEPROM cell capable of obtaining relatively better programming stability.

At least the other objective of the present invention is to provide a erasing method of a depletion-mode single-poly EEPROM cell capable of providing a relatively better erasing result.

To achieve these and other advantages and in accordance with the purpose of the invention, as embodied and broadly described herein, the invention provides a method for forming a depletion-mode single-poly electrically erasable programmable read-only memory (EEPROM) cell. The method comprises steps of providing a substrate having a floating region and a control region. Then, an isolation deep well and a deep well are formed in the floating region and the control region of the substrate respectively. A well region is formed in the isolation deep well simultaneously with forming an isolation well region between the isolation deep well and the deep well in the substrate. A depletion doped region and a cell implant region are formed at the well region of the substrate and the deep well of the substrate respectively. A floating gate structure is formed across over the floating region and the control region. Wherein, the floating gate structure exposes a portion of the depletion doped region and a portion of the cell implant region. Further, the floating structure comprises a floating gate, a gate dielectric layer and a tunneling dielectric layer and the gate dielectric layer is located between the cell implant region and the floating gate and the tunneling dielectric layer is located between the depletion doped region and the floating gate. An implantation process is performed to form a source/drain region and a heavily doped region in the exposed portion of the depletion doped region and the exposed portion of the cell implant region respectively.

According to the method for forming the depletion-mode single-poly EEPROM cell of one embodiment of the present invention, the method for forming the depletion doped region and the cell implant region comprises a medium current implantation process. Further, an implantation energy of the medium current implantation process is about 90~140 keV.

According to the method for forming the depletion-mode single-poly EEPROM cell of one embodiment of the present invention, the method for forming the floating gate structure comprises steps of forming a first dielectric layer on the substrate before the depletion doped region and the cell implant region are formed. Then, a portion of the first dielectric layer is removed to expose the surface of the floating region of the substrate after the depletion doped region and the cell implant region are formed. A second dielectric layer is formed on the floating region, wherein a first thickness of the first dielectric layer is larger than a second thickness of the second dielectric layer. A conductive layer is formed over the substrate. The conductive layer, the first dielectric layer and the second dielectric layer are patterned to form the floating gate, the gate dielectric layer and the tunneling dielectric layer respectively. In addition, the first thickness is about 100~1000 angstroms and the second thickness is about 80~120 angstroms. Also, the substrate further comprises a high voltage device region and a low voltage device region. At the step for removing the portion of the first dielectric layer to expose the surface of the floating region of the substrate, another portion of the first dielectric layer is also removed to expose the surface of the low voltage device region and the rest portion of the first dielectric layer remains on the control region and the high voltage device region. Under the circumstance mentioned above, the method further comprises steps of removing a portion of the second dielectric layer to expose the surface of the low voltage device region of the substrate after the second dielectric layer is formed. Then, a third dielectric layer is formed on the low voltage device region of the substrate before the conductive layer is formed, wherein a third thickness of the third dielectric layer is smaller than the second thickness. Moreover, in the step for patterning the conductive layer, a high voltage gate and a low voltage gate are formed over the high voltage device region of the substrate and the low voltage device region of the substrate respectively. Furthermore, the floating region and the control region are located in the high voltage device region.

The present invention also provides a depletion-mode single-poly EEPROM cell on a substrate having a floating region and a control region. The depletion-mode single-poly EEPROM cell comprises an isolation deep well, a deep well, a well region, a floating gate, a source/drain region, a heavily doped region, a depletion region and a cell implant region. The isolation deep well is located in the floating region of the substrate. The deep well is located in the control region of the substrate. The well region is located in the isolation deep well. The floating gate is located over the substrate and across the floating region and the control region and the floating gate exposes portions of the well region and the deep well respectively. The source/drain region is located at both sides of the floating gate in the well region of the substrate exposed by the floating gate. The heavily doped region is located at one side of the floating gate in the deep well of the substrate exposed by the floating gate. The depletion doped region is located under the tunneling dielectric layer and between the source/drain region, wherein the depletion doped region has a conductivity type the same as that of the source/drain region. The cell implant region is located under the gate dielectric layer and adjacent to the heavily doped region of the substrate.

According to the depletion-mode single-poly EEPROM cell of one embodiment of the present invention, the conductivity type of the isolation deep well is the same as that of the depletion doped region.

According to the depletion-mode single-poly EEPROM cell of one embodiment of the present invention, the conductivity type of the heavily doped region is the same as that of the cell implant region.

According to the depletion-mode single-poly EEPROM cell of one embodiment of the present invention, the conductive type of the heavily doped region is as same as that of the deep well.

According to the depletion-mode single-poly EEPROM cell of one embodiment of the present invention, a tunneling dielectric layer is located between the floating gate and the well region. The thickness of the tunneling dielectric layer is about 80~120 angstroms.

According to the depletion-mode single-poly EEPROM cell of one embodiment of the present invention, a gate dielectric layer is located between the floating gate and the deep well. The thickness of the gate dielectric layer is about 100~1000 angstroms.

According to the depletion-mode single-poly EEPROM cell of one embodiment of the present invention, the floating region and the control region are located in a high voltage device region of the substrate.

The present invention further provides a method for programming a depletion-mode single-poly EEPROM cell. The method comprises steps of providing a depletion-mode single-poly EEPROM cell and then performing a Fowler-Nordheim tunneling programming operation for programming the depletion-mode single-poly EEPROM cell. The depletion-mode single-poly EEPROM cell is located on a substrate having a floating region and a control region. The depletion-mode single-poly EEPROM cell comprises a floating gate, a source/drain region, a control deep well and a heavily doped region. The floating gate is located over the floating region and the control region of the substrate. The source/drain region is located at both sides of the floating gate in the floating region of the substrate, wherein the floating gate and the source/drain region together form a depletion mode memory cell. The control deep well is located in the control region, wherein the floating gate covers a portion of the control deep well. The heavily doped region located at one side of the floating gate in the control deep well of the substrate.

According to the programming method of one embodiment of the present invention, the Fowler-Nordheim tunneling programming operation is accomplished by applying a voltage on both of the floating region of the substrate and the heavily doped region and grounding both of the control deep well and the source/drain region. The voltage is about 10~20 volt.

According to the programming method of one embodiment of the present invention, the floating region and the control region are located in a high voltage device region of the substrate.

The present invention provides a method for erasing a depletion-mode single-poly EEPROM cell. The method comprises steps of providing a depletion-mode single-poly EEPROM cell and then performing a Fowler-Nordheim tunneling erasing operation for erasing the depletion-mode single-poly EEPROM cell. The depletion-mode single-poly EEPROM cell is located on a substrate having a floating region and a control region. The depletion-mode single-poly EEPROM cell comprises a floating gate, a source/drain region, a control deep well and a heavily doped region. The floating gate is located over the floating region and the control region of the substrate. The source/drain region is located at both sides of the floating gate in the floating region of the substrate, wherein the floating gate and the source/drain region together form a depletion mode memory cell. The control deep well is located in the control region, wherein the floating gate covers a portion of the control deep well. The heavily doped region located at one side of the floating gate in the control deep well of the substrate.

According to the erasing method of one embodiment of the present invention, the Fowler-Nordheim tunneling erasing operation is accomplished by applying a voltage on the source/drain region and grounding both of the floating region of the substrate and the heavily doped region. The voltage is about 9~12 volt. Alternatively, the voltage is also applied on the control deep well at the step for performing the Fowler-Nordheim tunneling erasing operation and the voltage is about 9~20 volt.

According to the erasing method of one embodiment of the present invention, the floating region and the control region are located in a high voltage device region of the substrate.

In the invention, the deep well/the control deep well is used as the control gate of the EEPROM cell, the EEPROM cell formed according to the present invention has only one polysilicon layer. Therefore, the difficulty for integrating the EEPROM with the single-poly device is decreased. According to the method of the present invention, the process for forming the depletion-mode single-poly EEPROM cell can be integrated with the process for forming the high voltage device. In addition, the transistor composed of the floating gate and the source/drain region of the depletion-mode single-poly EEPROM cell is a depletion mode memory cell so that the threshold voltage and the erase voltage of the depletion-mode single-poly EEPROM cell can be effectively decreased. Further, range of the operating voltage of the depletion-mode single-poly EEPROM cell is relatively larger so that it is easy to embed the depletion-mode single-poly EEPROM cell with the logic circuit, the mixture circuit or the high voltage device.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1D are top views schematically illustrating a method for forming a depletion-mode single-poly EEPROM cell. FIGS. 2A through 2D are cross-sectional views of FIGS. 1A through 1D along lines I-I and II-II schematically illustrating a method for forming a depletion-mode single-poly EEPROM cell.

Figure 1A:
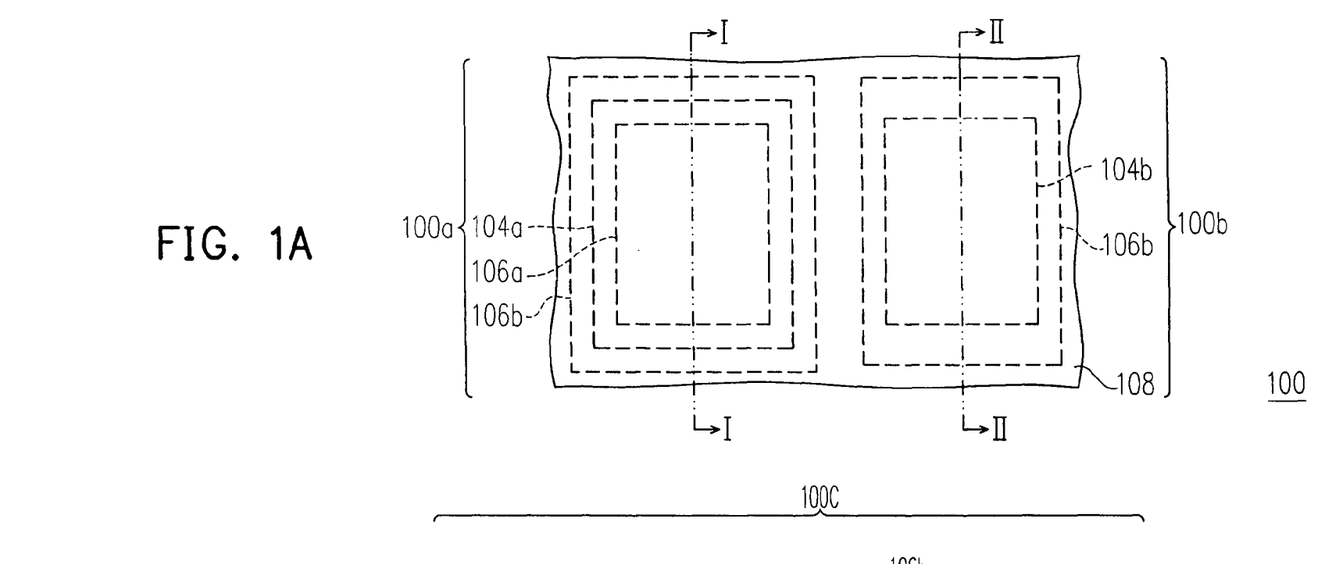
FIGS. 1A through 1D are top views schematically illustrating a method for forming a depletion-mode single-poly EEPROM cell.
Figure 2A:
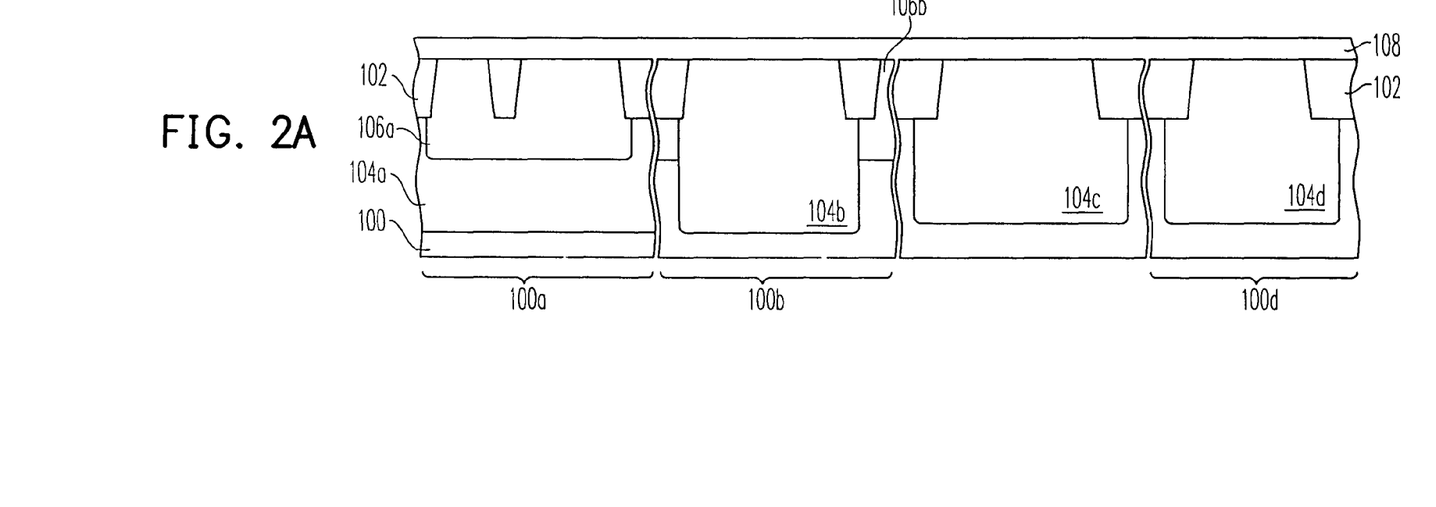
FIGS. 2A through 2D are cross-sectional views of FIGS. 1A through 1D along lines I-I and II-II schematically illustrating a method for forming a depletion-mode single-poly EEPROM cell.

As shown in FIG. 1A together with FIG. 2A, a substrate 100 is provided and the substrate 100 has a floating region 100a and a control region 100b. It should be noticed that the floating region 100a and the control region 100b are located in a high voltage device region 100c of the substrate 100. Moreover, besides the high voltage device region 100c, the substrate 100 further comprises a low voltage device region 100d. In addition, the device regions in the substrate 100 are isolated from each other by an isolation structure 102 respectively. The isolation structure 102 can be, for example but not limited to, a shallow trench isolation structure.

Then, an isolation deep well 104a and a deep well 104b are formed in the floating region 100a and the control region 100b of the substrate 100 respectively. Since the depletion-mode single-poly EEPROM cell is formed in the high voltage device region 100c of the substrate 100, it is necessary to form the isolation deep well 104a in the floating region 100a of the substrate 100. Therefore, the effect of the high voltage device (not shown) in the high voltage device region 100c onto the depletion-mode single-poly EEPROM cell in the floating region, which is operated at a low operating voltage, is decreased while the high operating voltage is applied onto the high voltage devices. Furthermore, the isolation deep well 104a and the deep well 104b have conductivity types which are different from that of the substrate 100. Also, while the isolation deep well 104a and the deep well 104b are formed in the floating region 100a and the control region 100b of the substrate 100 respectively, deep wells 104c and 104d are formed in a portion of the high voltage region 100c other than the floating region 100a and the control region 100b and in the low voltage region 100d of the substrate 100 respectively. Similarly, the deep wells 104c and 104d have conductivity types different from that of the substrate 100.

In the isolation deep well 104a and between the isolation deep well 104a and the deep well 104b of the substrate 100, a well region 106a and an isolation well region 106b are formed respectively. The well region 106a and the isolation well region 106b have conductivity types the same as that of the substrate 100 but different from those of the isolation deep well 104a and the deep well 104b. Thereafter, a first dielectric layer 108 is formed on the substrate 100. The first dielectric layer 108 can be, for example but not limited to, made from silicon oxide by a chemical vapor deposition. Furthermore, the thickness of the first dielectric layer 108 is about 100~1000 angstroms.

Figure 1B:
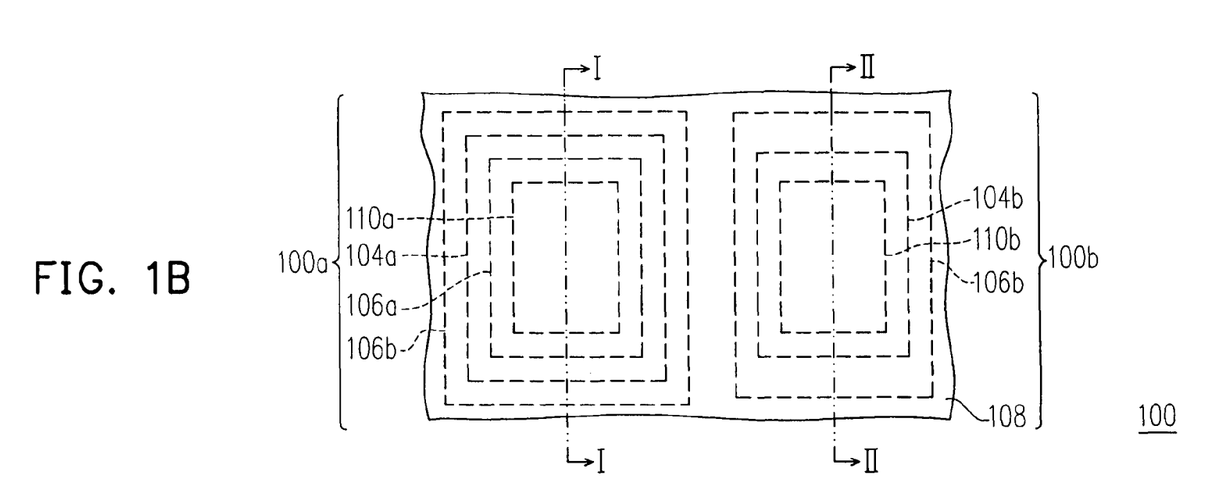
Figure 2B:
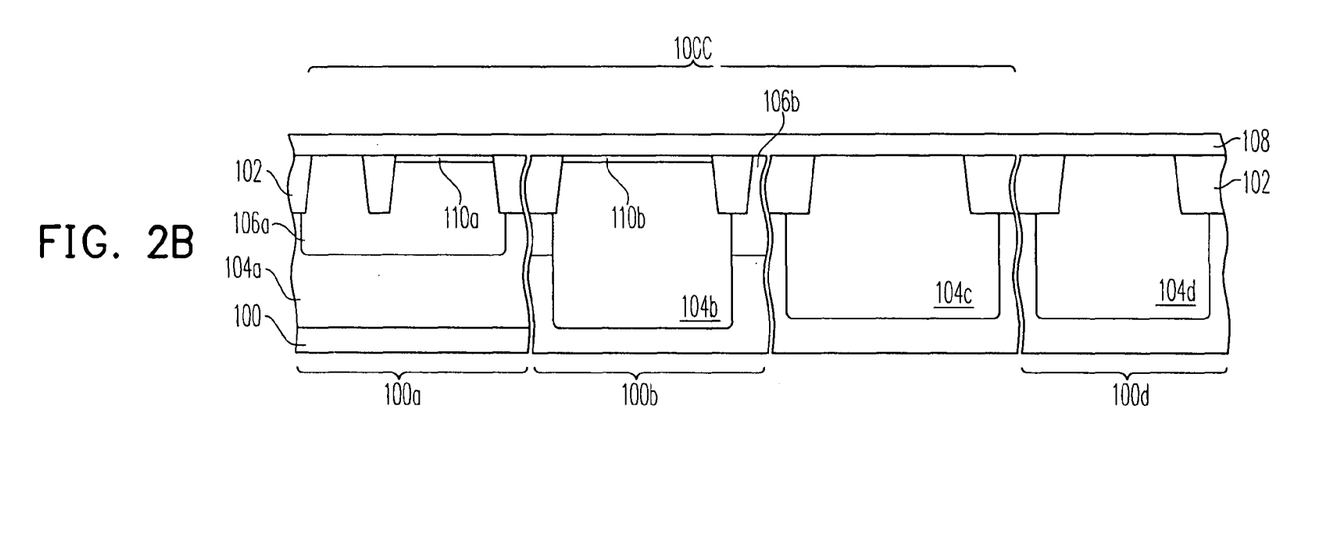

As shown in FIG. 1B and FIG. 2B, an implantation process is performed to from a depletion doped region 110a and a cell implant region 110b at the surfaces of portions of the substrate 100 in the well region 106a and the deep well region 104b respectively. The method for performing the aforementioned implantation process can be, for example, comprise steps of forming a patterned photoresist layer (not shown) over the substrate 100 to expose a portion of the first dielectric layer 108 over a predetermined region of the substrate 100 for forming the depletion doped region 110a and the cell implant region 110b and then performing an ion implantation process for forming the depletion doped region 110a and the cell implant region 110b in the well region 106a and the deep well region 104b of the substrate 100 respectively. The aforementioned ion implantation process can be a medium current implantation process and the implantation energy of the medium current implantation process is about 90~140 keV.

In the aforementioned embodiment, the implantation process for forming the depletion doped region 110a and the cell implant region 110b is performed after the first dielectric layer 108 is formed. However, in practice, the present invention is not limited to the process order mentioned above. That is, before the first dielectric layer 108 is formed, the aforementioned implantation process can be performed so as to form the depletion doped region 110a and the cell implant region 110b in the substrate 100.

Figure 1C:
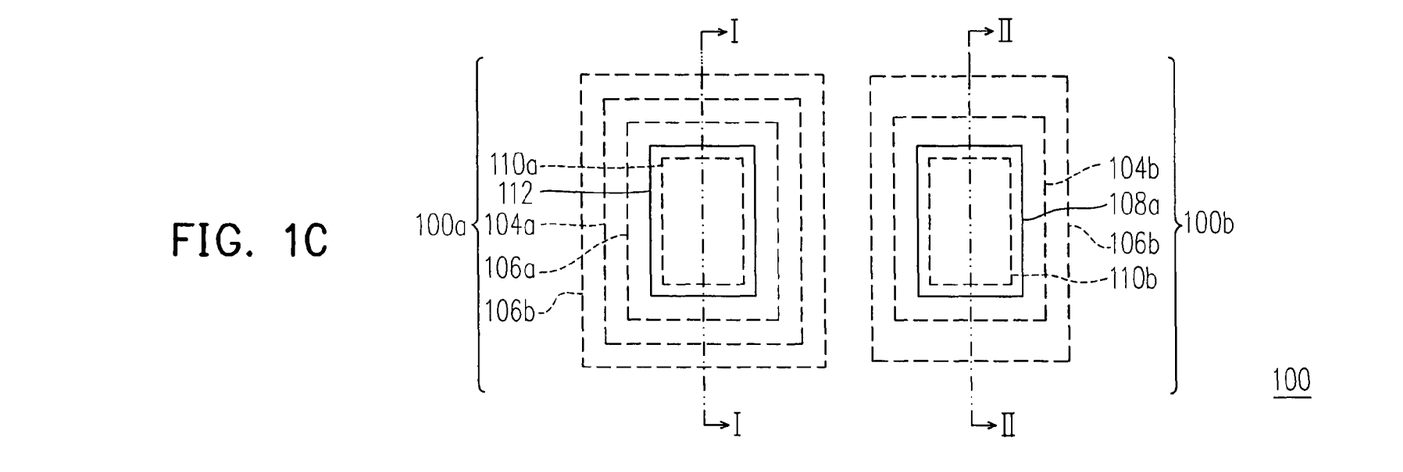
Figure 2C:
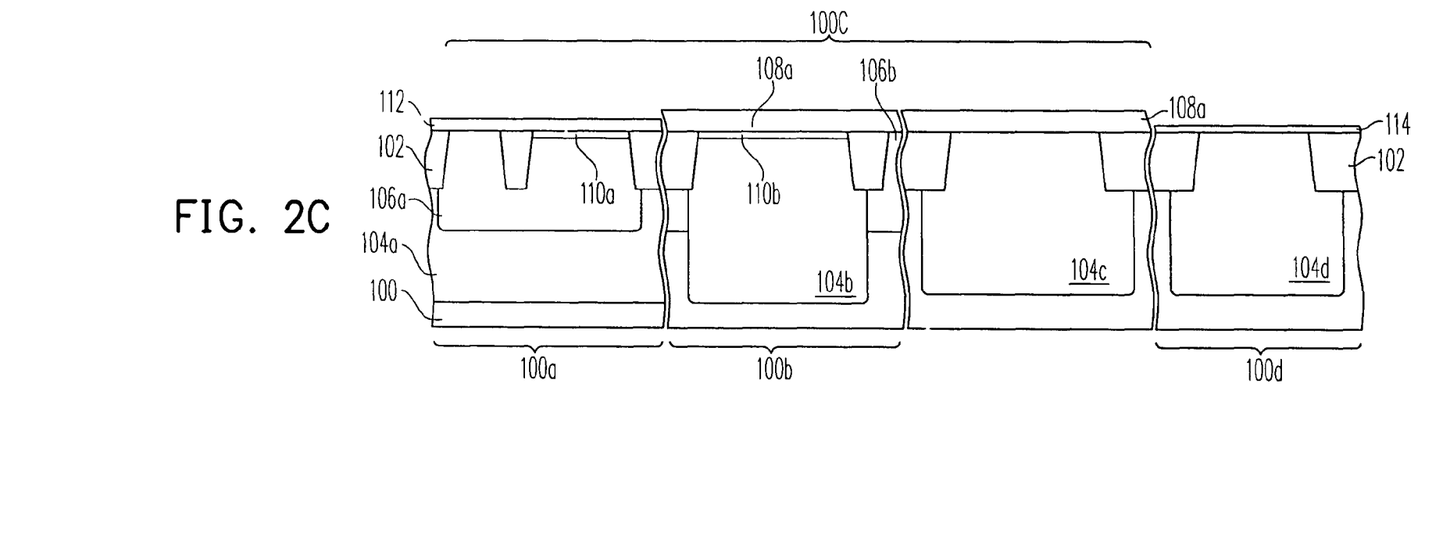

As shown in FIG. 1C and FIG. 2C, an etching process is performed to remove a portion of the first dielectric layer 108 to expose surfaces of the portions of the substrate 100 in the floating region 100a and the low voltage region 100d respectively. On the other words, the un-removed first dielectric layer 108a is located on a portion of the substrate 100 in the control region 100b and in the rest of the high voltage device region 100c. Then, a second dielectric layer 112 is formed on the well region 106a of the substrate 100. The second dielectric layer 112 can be, for example but not limited to, made from silicon oxide by the chemical vapor deposition and the thickness of the second dielectric layer 112 is about 80~120 angstroms. Noticeably, the thickness of the first dielectric layer 108a is larger than that of the second dielectric layer 112. Thereafter, a portion of the second dielectric layer 112 is removed to expose a portion of the substrate 100 in the low voltage device region 100d. On the exposed portion of the substrate 100 in the low voltage device region 100d, a third dielectric layer 114 is formed. The thickness of the third dielectric layer 114 is smaller than that of the second dielectric layer 112. The third dielectric layer 114 can be, for example, made from silicon oxide by the chemical vapor deposition.

In addition, when the substrate 100 further comprises a logic device region (not shown), after the third dielectric layer 114 is formed on the low voltage device region 100d of the substrate 100, a portion of the third dielectric layer 114 is removed to expose a portion of the substrate 100 in the logic device region and then a fourth dielectric layer (not shown) is formed on the exposed substrate 100 in the logic device region. The thickness of the fourth dielectric layer is about 60~70 angstroms.

Noticeably, the method for forming the second dielectric layer 112, the third dielectric layer 114 and even the fourth dielectric layer can, for example but not limited to, comprise steps of directly forming the second dielectric layer 112 on both of the first dielectric layer 108a and the rest portion of the substrate 100 exposed by the first dielectric layer 108a and then removing a portion of the second dielectric layer 112 to expose a portion of the substrate 100 in the low voltage device region 100d. Thereafter, the third dielectric layer 114 is formed on the second dielectric layer 112 in the floating region 100a and on the first dielectric layer 108a in both of the control region 100b and the high voltage device region 100c and on exposed portion of the substrate 100 in the low voltage device region 100d. At last, the stacked dielectric layer 114 in the logic device region is removed to expose a portion of the substrate 100 in the logic device region and then the fourth dielectric layer is formed on the exposed substrate 100 in the logic device region. That is, according to the requirement for the practical application, the dielectric layers are formed of the thickness from thick to thin on the substrate in various device regions orderly.

Figure 1D:
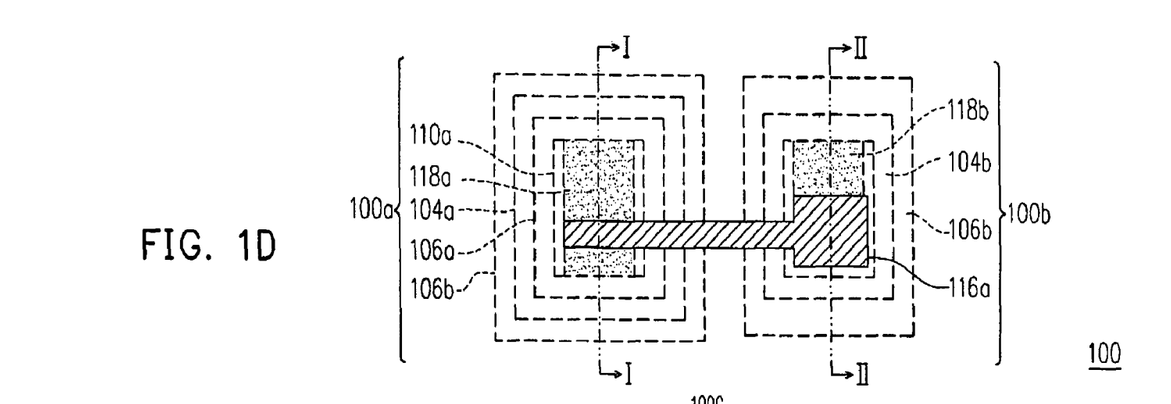
Figure 2D:
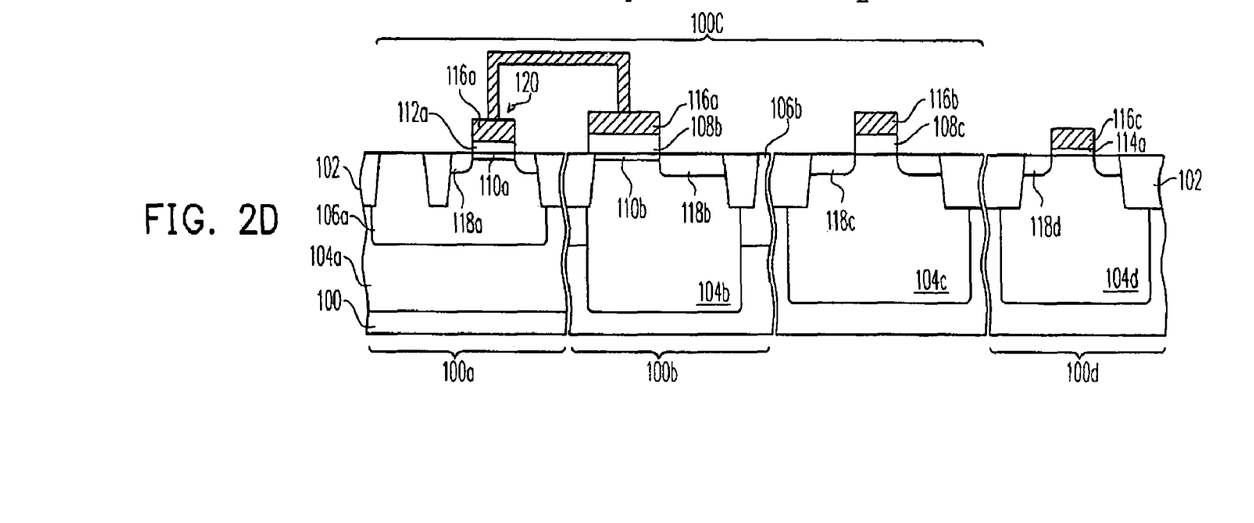

As shown in FIG. 1D and FIG. 2D, a conductive layer (not shown) is formed over the substrate 100. The conductive layer can be, for example but not limited to, made of polysilicon. The conductive layer, the first dielectric layer 108a, the second dielectric layer 112 and the third dielectric layer 114 are patterned to form a floating gate structure over the floating region 100a and the control region 100b, to form a high voltage gate structure over the high voltage device region 100c and to form a low voltage gate structure in the low voltage device region 100d. That is, the conductive layer is transformed into a floating gate across the floating region 100a and the control region 100b, a high voltage gate 116b in the high voltage device region 100c and a low voltage gate 116c in the low voltage device region 100d. In addition, the first dielectric layer 108a is transformed into a gate dielectric layer 108b in the control region 100b and a high voltage gate dielectric layer 108c in the high voltage device region 100c other than the floating region 100a and the control region 100b. Furthermore, the second dielectric layer 112 is transformed into a tunneling dielectric layer 112a and the third dielectric layer 114 is transformed into a low voltage dielectric layer 114a. The floating gate 116a is located in both of the floating region 100a and the control region 100b. In the floating region 100a, the floating gate 116a covers a portion of the substrate 100 and a portion of the depletion doped region 110a at both sides of the floating gate 116a is exposed. Moreover, in the control region 100b, the floating gate 116a covers a portion of the substrate 100 and a portion of the cell implant region 100b at one side of the floating gate 116a is exposed. The gate dielectric layer 108b is located between the cell implant region 110b and the floating gate 116a and the tunneling dielectric layer 112a is located between the depletion doped region 110a and the floating gate 116a.

Then, an implantation process is performed to form a source/drain region 118a in the exposed portion of the depletion doped region 110a and to form a heavily doped region 118b in the exposed portion of the cell implant region 110b. On the other words, the source/drain region 118a is located at both sides of the floating gate 116a in the well region 106a of the floating region 100a of the substrate 100 and the heavily doped region 118b is located at one side of the floating gate 116a in the deep well 104b of the control region 100b of the substrate 100. Additionally, at the time the source/drain region 118a and the heavily doped region 118b are formed, a high voltage device source/drain region 118c and a low voltage device source/drain region 118b are formed in portions of the substrate 100 exposed by the high voltage gate 116b and the low voltage gate 116c. It should be noticed that the conductivity type of the source/drain 118a is the same as that of the depletion doped region 110a. On the other words, the memory cell 120 (as shown in FIG. 2D) formed in the floating region 100a of the substrate 100 is a depletion mode memory cell. Moreover, the conductivity type of the heavily doped region 118b is the same as that of the cell implant region 110b. Further, the ion implantation concentration of the source/drain region 118a is larger than that of the depletion doped region 110a. Similarly, the ion implantation concentration of the heavily doped region 118b is larger than that of the cell implant region 110b.

Hereafter, the structure of a depletion-mode single-poly EEPROM cell according to the present invention is described with the used of FIG. 1D and FIG. 2D. As shown in FIG. 1D and FIG. 2D, the depletion-mode single-poly EEPROM cell of the present invention is disposed on the substrate 100 having a first conductivity type. The substrate 100 has the floating region 100a and the control region 100b which are adjacent to each other. Moreover, the substrate 100 further comprises the high voltage device region 100c and the low voltage device region 100d. Also, both of the floating region 100a and the control region 100b are located in the high voltage device region 100c. The depletion-mode single-poly EEPROM cell further comprises the isolation deep well 104a having a second conductivity type and the deep well 104b having the second conductivity type. The isolation deep well 104a is located in the floating region 100a of the substrate 100 and the deep well 104b is located in the control region 100b of the substrate 100. Since the conductivity type of the isolation deep well 104a is the same as that of the deep well 104b, the isolation deep well 104a and the deep well 104b can be formed in the same implantation process step. Furthermore, because the depletion-mode single-poly EEPROM cell of the present invention is formed in the high voltage device region 100c, a deep well 104c is also formed in a portion of the high voltage device region 100c other than the floating region 100a and the control region 100b at the time the isolation deep well 104a and the deep well 104b are formed. Simultaneously, a deep well 104d is also formed in the low voltage device region 100d at the time the isolation deep well 104a and the deep well 104b are formed. Moreover, the deep wells 104c and 104d possess the conductivity type the same as that of the isolation deep well 104a and the deep well 104b.

In addition, the depletion-mode single-poly EEPROM cell comprises the well region 106a having the first conductivity type and the isolation well region 106b having the first conductivity type. The well region 106a is located in the isolation deep well 104a and the isolation well region 106b is located between the isolation deep well 104a and the deep wells 104b, 104c and 104d for isolation purpose. Since the well region 106a has the conductivity type the same as that of the isolation well region 106b, the well region 106a and the isolation well region 106b can be formed in the same implantation process step.

Moreover, the depletion-mode single-poly EEPROM cell comprises the floating gate 116a. The floating gate 116a is located over the substrate and strides the floating region 100a and the control region 100b. Further, the tunneling dielectric layer 112a is located between the floating gate 116a and the well region 106a of the floating region 100a and the gate dielectric layer 108b is located between the floating gate 116a and the deep well 104b of the control region 100b. The thickness of the tunneling dielectric layer 112a is about 80~120 angstroms and the thickness of the gate dielectric layer 108b is about 100~1000 angstroms. The methods for forming the floating gate 106a, the tunneling dielectric layer 112a and the gate dielectric layer 108b are described above and are not depicted herein.

Furthermore, the depletion-mode single-poly EEPROM cell comprises a source/drain region 118a having the second conductivity type and the heavily doped region 118b having the second conductivity type. The source/drain region 118a is located at both sides of the floating gate 116a in the well region 106a of the floating region 100a of the substrate 100.

The heavily doped region 118b is located at one side of the floating gate 116a in the deep well 104b of the substrate 100. Moreover, the depletion doped region 110a having the second conductivity type is located between the source/drain regions 118a under the tunneling dielectric layer 112a in the substrate 100. Further, the cell implant region 110b having the second conductivity type is located adjacent to the heavily doped region 118b under the gate dielectric layer 108b in the substrate 100.

It should be noticed that the conductivity type of the source/drain region 118a in the well region 106a of the floating region 100a is the same as that of the depletion doped region 110a between the source/drain regions 118a. Therefore, the floating gate 116a, the tunneling dielectric layer 112a, the source/drain region 118a and the depletion doped region 110a together form a depletion-mode memory region 120. Also, since the depletion-mode single-poly EEPROM cell of the present invention is located in the high voltage device region 100c, the isolation deep well 104a with the conductivity type different from that of the substrate 100 but the same as that of the source/drain region 118a is arranged in the floating region 100a to prevent the depletion-mode single-poly EEPROM cell from being affected by the high voltage device while the high voltage, about 30 voltage, is applied onto the high voltage device. That is, the isolation deep well 104a is used to isolate the depletion-mode single-poly EEPROM cell from the nearby high voltage devices. Further, the heavily doped region 118b having the conductivity type the same as that of the cell implant region 110b and that of the deep well 104b is arranged in the control region 100b of the substrate 100 so that the well resistance of the deep well 104b, which is used as the control gate of the depletion-mode single-poly EEPROM cell, can be decreased. Also, the capacitance of the deep well 104b is increased and the parasitical capacitance is decrease. Hence, the performance of the programming-erasing cycle is improved.

Figure 3:
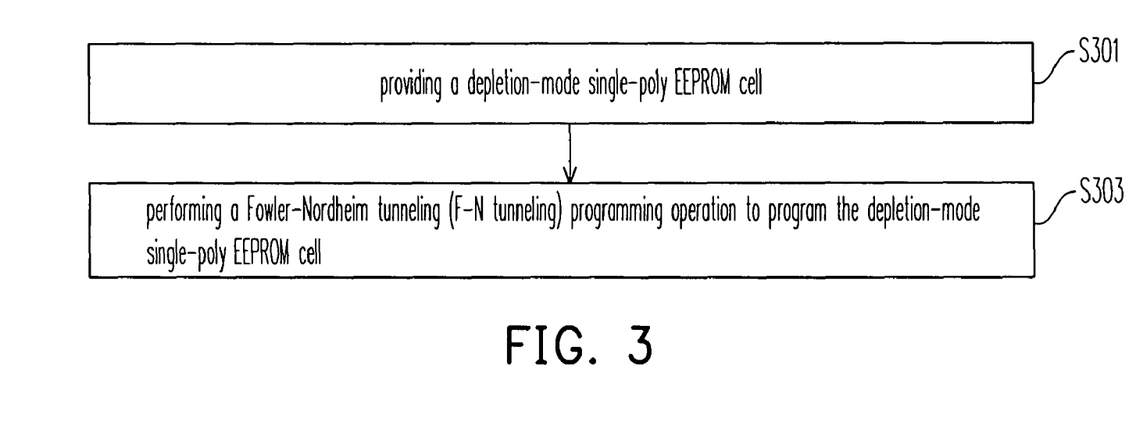
FIG. 3 is a flow chart showing a programming method of a depletion-mode single-poly EEPROM cell.

FIG. 3 is a flow chart showing a programming method of a depletion-mode single-poly EEPROM cell. As shown in FIG. 3 together with FIG. 2D, in the step S301, a depletion-mode single-poly EEPROM cell is provided. The depletion-mode single-poly EEPROM cell is located on the substrate 100 having the floating region 100a and the control region 100b. This depletion-mode single-poly EEPROM cell further comprises the floating gate 116a, the source/drain region 118a, the deep well 104b and the heavily doped region 118b. The floating gate 116a is disposed over the floating region 100a and the control region 100b and the source/drain region 118a is located at both sides of the floating gate 116a in the floating region 100a of the substrate 100. Moreover, the deep well 104b is located in the control region 100b of the substrate 100 and the heavily doped region 118b is located at one side of the floating gate 116a in the deep well 104b of the control region 100b of the substrate 100. The deep well region 104b is the control deep well of the depletion-mode single-poly EEPROM cell and the floating gate 116a covers a portion of the control deep well 104b. Further, the floating gate 116a and the source/drain region 118a together form a depletion mode memory cell 120.

In addition, since the depletion-mode single-poly EEPROM cell of the present invention is embedded in the high voltage device region 100c, the aforementioned depletion mode memory cell 120 located in the well region 106a is isolated from the nearby high voltage devices with the isolation deep well 104a. That is, the isolation deep well 104a surrounds the well region 106a and the source/drain region 118a of the depletion mode memory cell 120 is disposed in the well region 106a, wherein the conductivity type of the substrate 100 and the well region 106a is the first conductivity type and the conductivity type of the isolation deep well 104a and the source/drain region 118a is the second conductivity type. Furthermore, the conductivity type of the control deep well 104b and the heavily doped region 118b is the second conductivity type.

As shown in FIG. 3 together with FIG. 2D, in the step S303, a programming operation is performed to program the depletion-mode single-poly EEPROM cell in a way of Fowler-Nordheim tunneling (F-N tunneling). When the first conductivity type is P type and the second conductivity type is N type, the F-N tunneling programming operation can be accomplished by applying a voltage on both of the well region 106a of the floating region 100a and the heavily doped region 118b and grounding both of the control deep well 104b of the control region 100b and the source/drain region 118a. It should be noticed that, while the control deep well 104b is grounded for performing the F-N tunneling programming operation, the isolation deep well 104a can be grounded as well. Under the circumstance mentioned above, the external applied voltage is about 10~20 volt.

Figure 4:
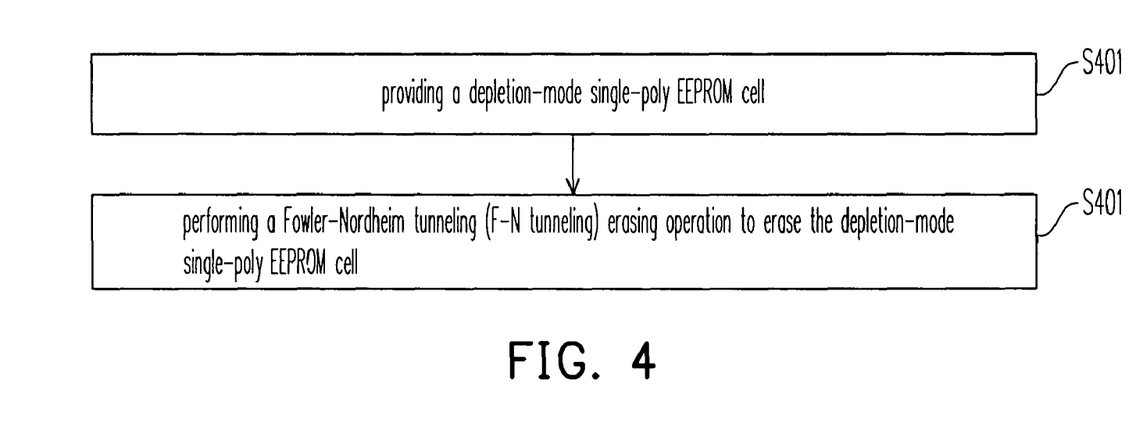
FIG. 4 is a flow chart showing a erasing method of a depletion-mode single-poly EEPROM cell.

FIG. 4 is a flow chart showing a erasing method of a depletion-mode single-poly EEPROM cell. As shown in FIG. 4 together with FIG. 2D, similar to the programming operation, in the step S401, a depletion-mode single-poly EEPROM cell is provided. The structure and the components of the depletion-mode single-poly EEPROM cell are the same as those of the depletion-mode single-poly EEPROM cell mentioned in the previous embodiment and are not detail described herein. In the step S403, an erasing operation is performed to erase the depletion-mode single-poly EEPROM cell in a way of F-N tunneling. When the first conductivity type is P type and the second conductivity type is N type, the F-N tunneling erasing operation can be accomplished by applying a voltage on the source/drain region 118a and grounding both of the well region 106a of the floating region 100a and the heavily doped region 118b. The external applied voltage mentioned above is about 9~12 volt. Alternatively, the F-N tunneling erasing operation can be accomplished by applying a voltage on all of the control deep well 104b, the isolation deep well 104a and the source/drain region 118a and grounding both of the well region 106a of the floating region 100a and the heavily doped region 118b. The aforementioned external applied voltage is about 9~20 volt.

In the invention, by using the deep well 104b of the control region 100b as the control gate of the EEPROM cell, the EEPROM cell formed according to the present invention has only one polysilicon layer which is the floating gate. Therefore, the difficulty for integrating the EEPROM with the single-poly device such as the high voltage device, the low voltage device and the logic device is decreased. According to the method of the present invention, the process for forming the depletion-mode single-poly EEPROM cell can be integrated with the process for forming the high voltage device. Further, by using the isolation deep well to isolate the depletion-mode single-poly EEPROM cell from the nearby high voltage devices, the mutual influence between the high voltage device and the depletion-mode single-poly EEPROM cell can be prevented while the high voltage device and the depletion-mode single-poly EEPROM cell are operated.

In addition, the transistor composed of the floating gate and the source/drain region of the depletion-mode single-poly EEPROM cell is a depletion mode memory cell so that the threshold voltage and the erase voltage of the depletion-mode single-poly EEPROM cell can be effectively decreased. Further, range of the operating voltage of the depletion-mode single-poly EEPROM cell is relatively larger so that it is easy to embed the depletion-mode single-poly EEPROM cell with the logic circuit, the mixture circuit or the high voltage device. Additionally, by performing the method of the present invention, the depletion-mode single-poly EEPROM cell of the present invention can be easily integrated with the sub-micron CMOS.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A depletion-mode single-poly EEPROM cell on a substrate, wherein the substrate has a floating region and a control region, the depletion-mode single-poly EEPROM cell comprising:
    an isolation deep well located in the floating region of the substrate;
    a deep well located in the control region of the substrate;
    a well region located in the isolation deep well, wherein the deep well is deeper than the well region, and a depth of the deep well is similar to a depth of the isolation deep well;
    a floating gate comprising a first portion and a second portion, wherein the first portion is located in the floating region and the second portion is located in the control region and-the first portion and the second portion are electrically connected;
    source/drain regions, one source/drain region located at each side of the floating gate in the well region of the substrate and aligned with the floating gate;
    a heavily doped region located at one side of the floating gate in the deep well of the substrate exposed by the floating gate, and being next to and directly contacting an isolation structure in the substrate;
    a depletion doped region located under a tunneling dielectric layer and extending from one of the source/drain regions to another of the source/drain regions continuously, wherein the depletion doped region has a conductivity type the same as that of the source/drain regions; and
    a cell implant region located under a gate dielectric layer, adjacent to the heavily doped region of the substrate and directly contacting the deep well.

2. The depletion-mode single-poly EEPROM cell of claim 1, wherein the conductivity type of the isolation deep well is the same as that of the depletion doped region and that of the source/drain regions, and different from that of the well region.

3. The depletion-mode single-poly EEPROM cell of claim 2, wherein the conductivity type of the heavily doped region is the same as that of the source/drain regions.

4. The depletion-mode single-poly EEPROM cell of claim 3, wherein the depletion doped region is directly connected to the source/drain regions.

5. The depletion-mode single-poly EEPROM cell of claim 3, wherein an ion implantation concentration of the source/drain regions is larger than that of the depletion doped region.

6. The depletion-mode single-poly EEPROM cell of claim 3, wherein an ion implantation concentration of the heavily doped region is larger than that of the cell implant region.

7. The depletion-mode single-poly EEPROM cell of claim 1, wherein the conductivity type of the heavily doped region is the same as that of the cell implant region and that of the deep well.

8. The depletion-mode single-poly EEPROM cell of claim 1, wherein the tunneling dielectric layer is located between the floating gate and the well region.

9. The depletion-mode single-poly EEPROM cell of claim 8, wherein the thickness of the tunneling dielectric layer is about 80~120 angstroms.

10. The depletion-mode single-poly EEPROM cell of claim 1, wherein the gate dielectric layer is located between the floating gate and the deep well.

11. The depletion-mode single-poly EEPROM cell of claim 10, wherein the thickness of the gate dielectric layer is about 100~1000 angstroms.

12. The depletion-mode single-poly EEPROM cell of claim 1, wherein the floating region and the control region are located in a high voltage device region of the substrate.

13. The depletion-mode single-poly EEPROM cell of claim 1, wherein the heavily doped region is located only at one side of the floating gate.

14. The depletion-mode single-poly EEPROM cell of claim 13, wherein the isolation structure is further located at the other side of the floating gate and the cell implant region is directly connected to the isolation structure and the heavily doped region.

15. The depletion-mode single-poly EEPROM cell of claim 14, wherein the depletion doped region is directly connected to the source/drain regions.

16. The depletion-mode single-poly EEPROM cell of claim 1, wherein the tunneling dielectric layer is thinner than the gate dielectric layer.

17. The depletion-mode single-poly EEPROM cell of claim 1, wherein the depletion doped region is directly connected to the source/drain regions.

18. The depletion-mode single-poly EEPROM cell of claim 1, wherein the tunneling dielectric layer is separated from the well region by the depletion doped region.

19. The depletion-mode single-poly EEPROM cell of claim 1, wherein the source/drain regions contacts the well region.

20. The depletion-mode single-poly EEPROM cell of claim 1, wherein the heavily doped region contacts the deep well.

* * * * *